United States Patent [19]

Marabotto et al.

[11] Patent Number: 5,013,174
[45] Date of Patent: May 7, 1991

[54] DUAL FUNCTION FASTENER

[75] Inventors: Eduardo J. Marabotto, Miami; Peter Gilmore, Plantation, both of Fla.

[73] Assignee: Motorola, Inc., Schaumburg, Ill.

[21] Appl. No.: 445,512

[22] Filed: Dec. 4, 1989

[51] Int. Cl.⁵ .............................................. F16B 17/00
[52] U.S. Cl. .................................. 403/11; 403/407.1; 29/402.06; 29/402.12; 411/501
[58] Field of Search .............................. 403/11, 407.1; 29/402.08, 402.15, 402.14, 402.06, 402.12, 402.17; 411/338, 339, 501, 500, 173, 177, 183; 264/249

[56] References Cited

U.S. PATENT DOCUMENTS

| 3,352,195 | 11/1967 | Fisher | 411/338 X |
| 3,544,143 | 12/1970 | Ohlssoy | 411/501 X |
| 4,384,803 | 5/1983 | Cachia | 411/339 X |
| 4,461,593 | 7/1984 | Rodseth | 403/11 |

Primary Examiner—Andrew V. Kundrat
Attorney, Agent, or Firm—Pablo Meles

[57] ABSTRACT

A removable deformable portion 16 of a boss (12) initially fastens a first member 14 to a second member 18. Subsequent to removal of the deformable portion 16, a means (15 and 20) for alternatively fastening the first member 14 to the second member 18 fastens the first and second members.

17 Claims, 2 Drawing Sheets

DUAL FUNCTION FASTENER

TECHNICAL FIELD

This invention relates generally to the field of fasteners, and more specifically to repairable fasteners suitable for use in electronic products.

BACKGROUND

Electronic products typically have their circuitry mounted on substrates, commonly printed circuit boards. In turn, efficient manufacturing methods requires the fastening of the printed circuit board to the housing of the electronic product. One such method provides for mounting a printed circuit board on a boss formed in a housing via a hole formed in the printed circuit board. The portion of the boss remaining above the printed circuit board after mounting is then deformed by heat staking or ultrasonically welding to form a cap above the printed circuit board. Deforming the boss is an efficient manufacturing method for fastening a printed circuit board to a housing, but this method fails to provide a reusable, repairable fastener.

Repairing presently used heat staked or ultrasonically welded fasteners requires the tedious removal of the deformed portion in order to obtain easy access to the printed circuit board. Furthermore, once the heat staked portion is removed and the printed circuit board is repaired, the boss can not be easily reused for refastening the printed circuit board to the housing. More likely than not, the entire housing portion may require replacement since there is no easy method of refastening the housing to the circuit board. Thus, a need exists for a repairable boss formed in a first member for fastening a second member such as a printed circuit board once a portion of the boss is removed.

SUMMARY OF THE INVENTION

Accordingly, it is an object of the present invention to provide a boss formed in a first member which is used to fasten a second member to the first member.

Briefly, according to the invention, a removable deformable portion of the boss initially fastens the first member to the second member. Subsequent to the removal of the deformable portion, a means for alternatively fastening the first member to the second member fastens the first and second members.

DETAILED DESCRIPTION OF THE PREFERRED EMBODIMENT

Figure 1:
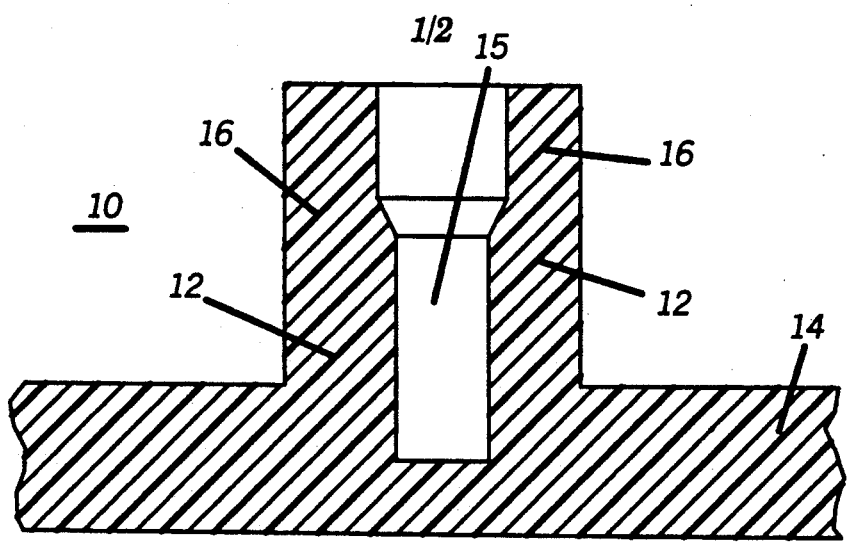
FIG. 1 is a fragmentary cross-sectional view of a boss in accordance with the present invention.

Referring to FIG. 1, there is shown a mendable fastener 10 in accordance with the present invention. The mendable fastener 10 comprises a first member 14, preferably a housing formed of a hard, yet deformable plastic which has a boss formed therein. The boss is formed in a substantially cylindrical shape having a sidewall 12 including a corresponding removable deformable portion 16. A hole or cavity 15 defines the inside of the sidewall 12. A second member 18, generally a substrate and preferably a printed circuit board having an aperture therein, (shown in FIGS. 2,3, and 4) mounts about the sidewall 12 (the boss) via the aperture in the member 18.

Figure 2:
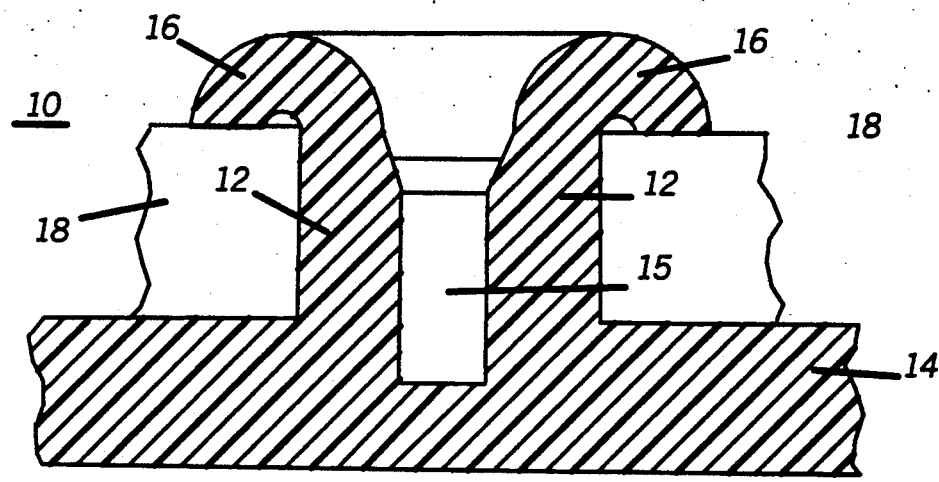
FIG. 2 is a fragmentary cross-sectional view of a boss fastened to a substrate in accordance with the present invention.

Referring to FIG. 2, once the substrate 18 is mounted onto the body 14, the substrate 18 is fastened to the body 14 by deforming the deformable portion 16 of the sidewall 12. The deformable portion 16 is preferably deformed using heat staking or alternatively by ultrasonically welding. The hole 15 preferably has a taper feature near its opening that would make the deformable portion 16 prone to deform towards the substrate 18. A mounted printed circuit board fastened to the first member 14 or housing typically leaves a manufacturing plant in this packaged manner.

Figure 3:
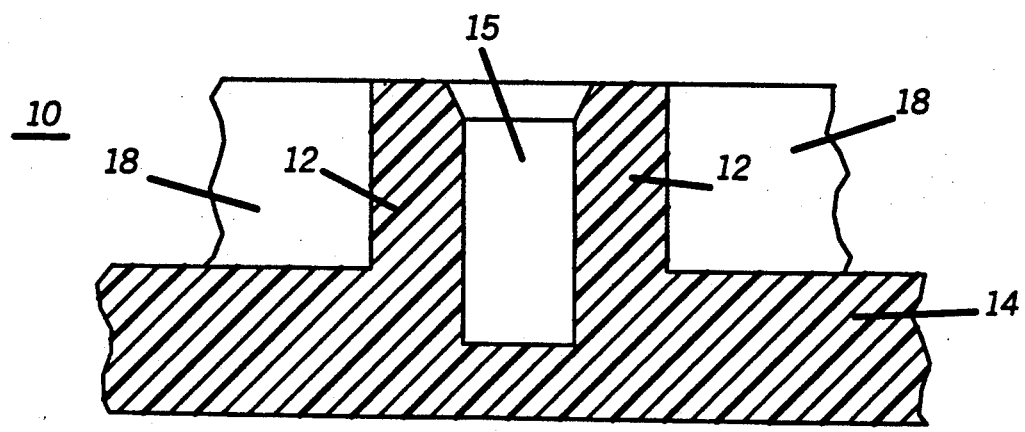
FIG. 3 is a fragmentary cross-sectional view of the boss of FIG. 2 subsequent to the removal of a deformable portion of the boss.
Figure 4:
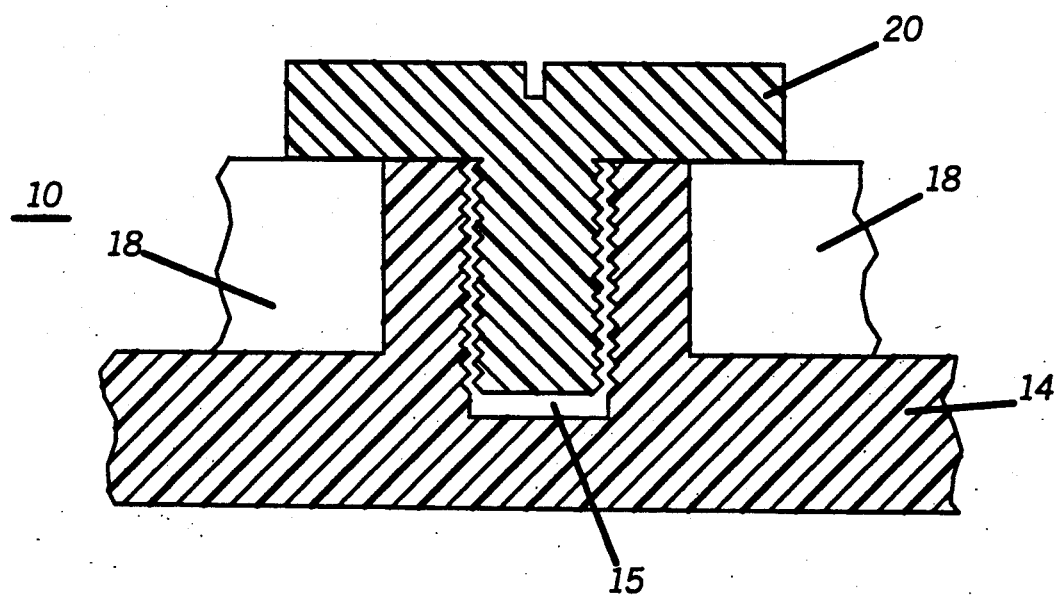
FIG. 4 is a fragmentary cross-sectional view of a boss with an alternative fastener in accordance with the present invention.

Referring to FIG. 3, if the electronic product requires repair due to a failure on the mounted printed circuit board (18), the board (18) can be dismounted from the housing (14) by removing the deformable portion 16. The deformable portion 16 is preferably removed by using specially designed snips (not shown) or by other known methods including drilling off the deformable portion 16. Once the printed circuit board (18) is repaired, the printed circuit board (18) can be mounted again over remaining portions of the sidewall 12 (the boss). Now, the printed circuit board (18) can be alternatively fastened to the housing (14) by using numerous methods. One illustrated method is shown in FIG. 4, where the hole 15 is tapped in order to receive a screw 20 having an oversized head that overlaps the remaining portion of the arms 12 along with a portion of the printed circuit board (18). The threads can be molded into the sidewall 12 during manufacture or the screw 20 can be self tapping. Other methods of fastening the printed circuit board (18) to the housing (14) include press fitting a pin with an over sized head into the hole 15. FIG. 4 is merely illustrative of the alternative fastening methods suitable for the present invention and does not suggest any limitation thereby.

What is claimed is:

1. A boss formed on a first member and used to fasten a second member to the first member, comprising:
    a deformable portion of the boss, arranged and constructed to protrude through an aperture in the second member, for initially fastening the first member to the second member by deforming the deformable portion, said deformable portion being removable by such means as cutting or burning; and
    means, subsequent to removal of the deformed portion and utilizing the remaining portion, for alternatively fastening the first member to the second member.

2. The boss of claim 1, wherein the deformable portion comprises a nonconductive matrial such as plastic.

3. The boss of claim 1, wherein the second member comprises a substrate.

4. The boss of claim 1, wherein the first member is initially fastened to the second member by heat staking the deformable portion.

5. The boss of claim 1, wherein the first member is initially fastened to the second member by ultrasonically welding the deformable portion.

6. The boss of claim 1, wherein the boss is arranged and constructed to receive the means within a hole formed within the boss after the deformed portion is removed.

7. The boss of claim 6, wherein the means for alternatively fastening comprises a tapped hole formed in the boss for receiving a screw.

8. The boss of claim 7, wherein the first member is alternatively fastened to the second member by removing the deformed portion and inserting a screw having a head for retaining the first member to the second member.

9. A boss on a first member and used to fasten a second member to the first member, comprising:
   a deformable portion of the boss, arranged and constructed to protrude through an aperture in the second member for fastening the first member to the second member by deforming the deformable portion said deformable portion being removable by such means as cutting or burning; and
   means on the remaining portion for receiving an alternative fastener for fastening the first member to the second member subsequent to removal of the deformed portion.

10. The boss of claim 9, wherein the deformable portion is permanently deformable.

11. The boss of claim 9, wherein the deformable portion comprises a nonconductive material such as plastic and the second member comprises a substrate.

12. The boss of claim 9, wherein the boss is arranged and constructed to receive the means within a hole formed within the boss.

13. The boss of claim 9, wherein the means for receiving an alternative fastener comprises a tapped hole formed in the boss for receiving a screw.

14. The boss of claim 13, wherein the first member is alternatively fastened to the second member by removing the deformed portion and inserting a screw having a head for retaining the first member to the second member.

15. A method for fastening a first member to a second member where the first member comprises a boss having a deformable portion for fastening the first member to the second member and a means for receiving an alternative fastener, comprising the steps of:
   (a) removing the deformed portion; and
   (b) fastening the first member to the second member using the means for receiving an alternative fastener.

16. A boss, formed on a radio housing, suitable for fastening a printed circuit board to the radio housing comprising:
   a substantially cylindrical shaped sidewall having a removable deformable portion formed in the boss for fastened the radio housing the printed circuit board by deforming the portion;
   means remaining, subsequent to removal of a portion of the deformable portion, for alternatively fastening the radio housing to the printed circuit board.

17. The boss of claim 16, wherein the means comprises a hole formed in the remaining portion of the boss for receiving a screw with a head.

* * * * *